United States Patent
Ye

(10) Patent No.: US 8,009,428 B1
(45) Date of Patent: Aug. 30, 2011

(54) GUIDING APPARATUS

(75) Inventor: Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/873,222

(22) Filed: Aug. 31, 2010

(30) Foreign Application Priority Data

Aug. 9, 2010 (CN) .......................... 2010 1 0248370

(51) Int. Cl.
*H05K 7/20* (2006.01)
*H05K 5/00* (2006.01)
*H01L 23/10* (2006.01)
*G06F 1/20* (2006.01)

(52) U.S. Cl. ... 361/710; 361/707; 361/719; 361/679.54; 165/80.3; 257/706

(58) Field of Classification Search .................. 257/706; 165/80.3
See application file for complete search history.

(56) References Cited

U.S. PATENT DOCUMENTS

| | | | |
|---|---|---|---|
| 5,220,485 A * | 6/1993 | Chakrabarti | 361/720 |
| 5,748,446 A * | 5/1998 | Feightner et al. | 361/709 |
| 5,901,039 A * | 5/1999 | Dehaine et al. | 361/704 |
| 5,999,405 A * | 12/1999 | Zappacosta et al. | 361/704 |
| 6,055,159 A * | 4/2000 | Sun | 361/704 |
| 6,141,220 A * | 10/2000 | Lin | 361/704 |
| 6,219,251 B1 * | 4/2001 | Wang | 361/752 |
| 6,307,747 B1 * | 10/2001 | Farnsworth et al. | 361/704 |
| 6,307,748 B1 * | 10/2001 | Lin et al. | 361/704 |
| 6,545,879 B1 * | 4/2003 | Goodwin | 361/807 |
| 6,549,410 B1 * | 4/2003 | Cohen | 361/704 |
| 6,585,534 B2 * | 7/2003 | Llapitan et al. | 439/327 |
| 6,722,908 B2 * | 4/2004 | Llapitan et al. | 439/327 |
| 6,724,632 B2 * | 4/2004 | Lee et al. | 361/719 |
| 6,957,966 B2 * | 10/2005 | Martin et al. | 439/74 |
| 7,042,727 B2 * | 5/2006 | Ulen et al. | 361/704 |
| 7,057,897 B2 * | 6/2006 | Leu | 361/704 |
| 7,110,261 B2 * | 9/2006 | Lee et al. | 361/704 |
| 7,144,762 B2 * | 12/2006 | So | 438/122 |
| 7,190,591 B2 * | 3/2007 | Peng et al. | 361/719 |
| 7,262,969 B2 * | 8/2007 | Lee et al. | 361/704 |
| 7,272,007 B2 * | 9/2007 | Lee et al. | 361/704 |
| 7,345,880 B2 * | 3/2008 | Lo | 361/704 |
| 7,347,249 B2 * | 3/2008 | Lin | 165/80.2 |
| 7,573,716 B2 * | 8/2009 | Sun et al. | 361/719 |
| 7,609,522 B2 * | 10/2009 | Jin et al. | 361/710 |
| 7,619,890 B2 * | 11/2009 | Tseng et al. | 361/700 |
| 7,626,822 B2 * | 12/2009 | Ma et al. | 361/719 |

(Continued)

*Primary Examiner* — Bradley Thomas
(74) *Attorney, Agent, or Firm* — Altis Law Group, Inc.

(57) ABSTRACT

A guiding apparatus for guiding a heat sink easily to be attached to a circuit board to cool an electronic element mounted on the circuit board and includes a seat, and a pair of guiding members. The heat sink includes a pair of fasteners movably attached thereto. A number of flexible barbs are formed at an end of each fastener. The seat is elongated and includes a sliding groove defined therein along a length thereof. Each guiding member includes a post, a first block, a second block, and a resilient member. The first and second blocks surround the post. The first block is received in the sliding groove. The resilient member slidably surrounds the post and sandwiched between the second block and the seat. A locating hole is defined in the post adjacent to the second block to receive the barbs of the fastener.

12 Claims, 4 Drawing Sheets

U.S. PATENT DOCUMENTS

| | | | |
|---|---|---|---|
| 7,729,122 B2 * | 6/2010 | Wong | 361/710 |
| 7,796,390 B1 * | 9/2010 | Cao et al. | 361/704 |
| 7,808,791 B2 * | 10/2010 | Li et al. | 361/719 |
| 7,817,427 B2 * | 10/2010 | Li et al. | 361/719 |
| 7,885,072 B2 * | 2/2011 | Wu et al. | 361/700 |
| 2003/0159819 A1 * | 8/2003 | Lee | 165/185 |
| 2005/0111190 A1 * | 5/2005 | Wang et al. | 361/704 |
| 2006/0007659 A1 * | 1/2006 | Lee et al. | 361/704 |
| 2007/0045283 A1 * | 3/2007 | Nishikawa | 219/494 |
| 2007/0217159 A1 * | 9/2007 | Long et al. | 361/704 |
| 2009/0050308 A1 * | 2/2009 | Kuo | 165/185 |

* cited by examiner

GUIDING APPARATUS

BACKGROUND

1. Technical Field

The present disclosure relates to a guiding apparatus used in mounting a heat sink to a circuit board.

2. Description of Related Art

Heat sinks are often used to cool electronic elements mounted on a circuit board, such as a CPU. Through holes are defined in a base of the heat sink and mounting holes are correspondingly defined in the circuit board. Fasteners extend through the through holes to engage in the mounting holes to attach the heat sink to the circuit board. However, it is hard to locate the wanted mounting holes among so many other holes defined in the circuit board.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
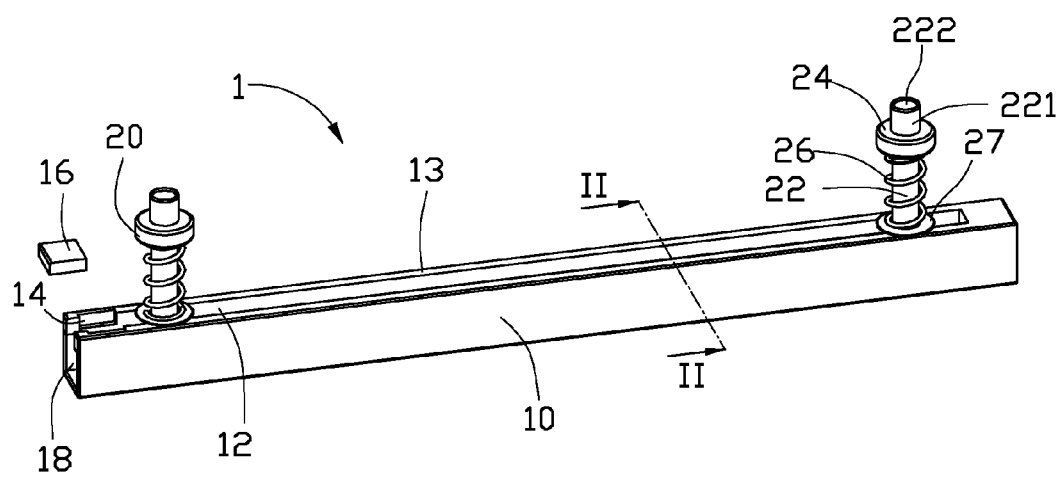
FIG. 1 is a partial, isometric view of an exemplary embodiment of a guiding apparatus.
Figure 4:
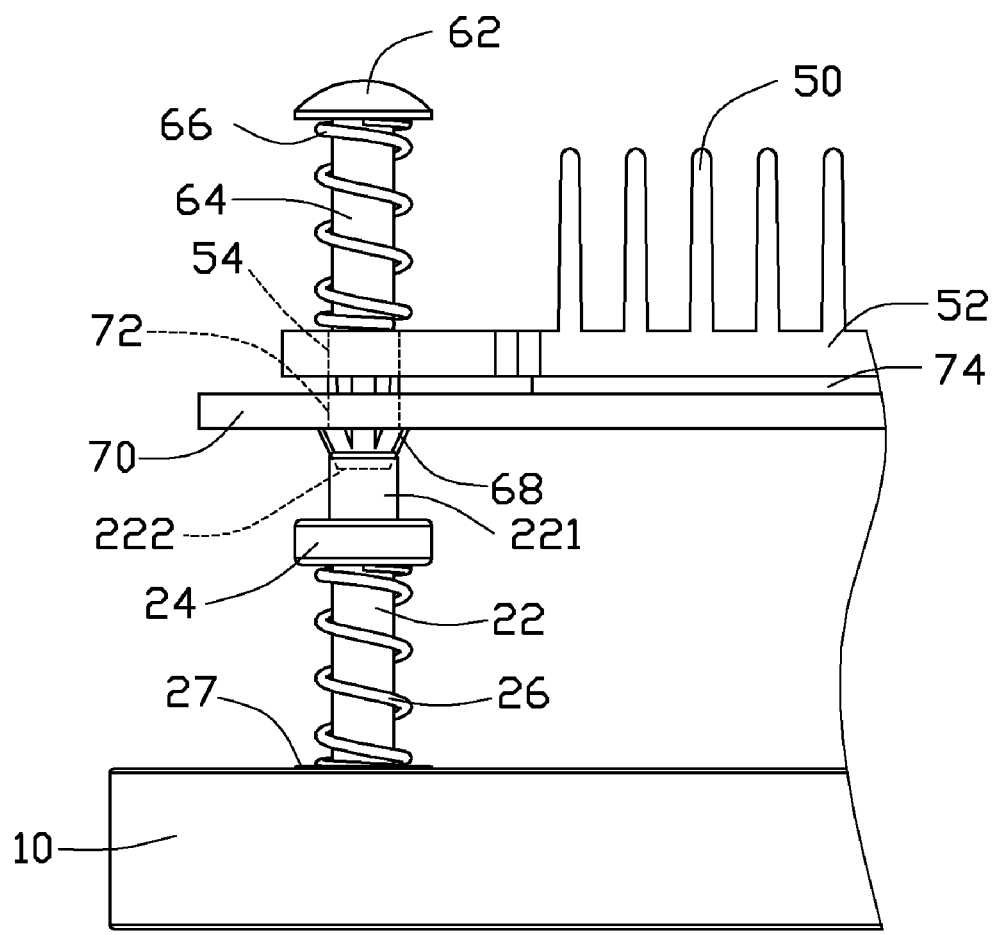
FIG. 4 is a partial side view of FIG. 3.

Referring to FIGS. 1 and 4, an exemplary embodiment of a guiding apparatus 1 is provided for guiding a heat sink 50 to be easily attached to a circuit board 70 to cool an electronic element 74 mounted on the circuit board 70. The guiding apparatus 1 includes a seat 10, and a pair of guiding members 20 slidably attached to the seat 10.

Figure 2:
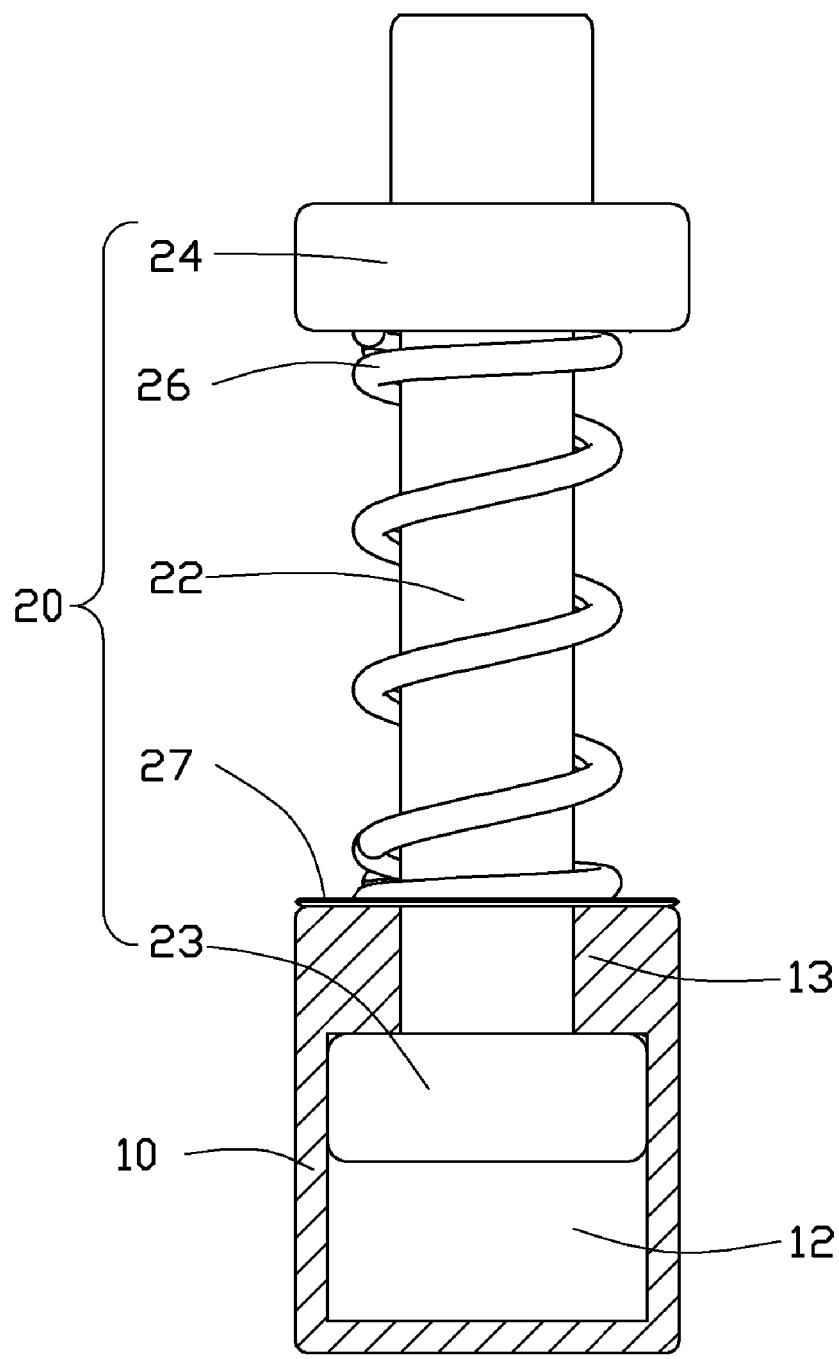
FIG. 2 is a cross-sectional view of the guiding apparatus of FIG. 1 taken along line II-II.

Referring also to FIG. 2, the seat 10 is channel-shaped. An inverted T-shaped sliding groove 12 is defined in the seat 10, extending through a middle of a top wall 13 of the seat 10 along a length direction of the seat 10. A limiting slot 14 is defined in the top wall 13 of the seat 10 along a width of the seat 10, for receiving a limiting board 16 therein. The sliding groove 12 further extends through one end of the seat 10 to form an entry 18.

Each of the guiding members 20 includes a post 22, a first circular block 23, a second circular block 24, a resilient member 26, and a gasket 27. The first block 23 is formed at a first end of the post 22. The second block 24 detachably surrounds the post 22 adjacent to a second end 221 of the post 22. In the embodiment, the second block 24 may threadedly engage with the post 22. A locating hole 222 is defined in the second end 221 of the post 22. The gasket 27 slidably surrounds the post 22 and located between the first and second blocks 23 and 24. The resilient member 26 is a coil spring and slidably surrounds the post 22 and located between the second block 24 and the gasket 27. In other embodiment, the gasket 27 may be omitted when the size of the resilient member 26 is large enough to contact the top wall 13 of the seat 10.

Figure 3:
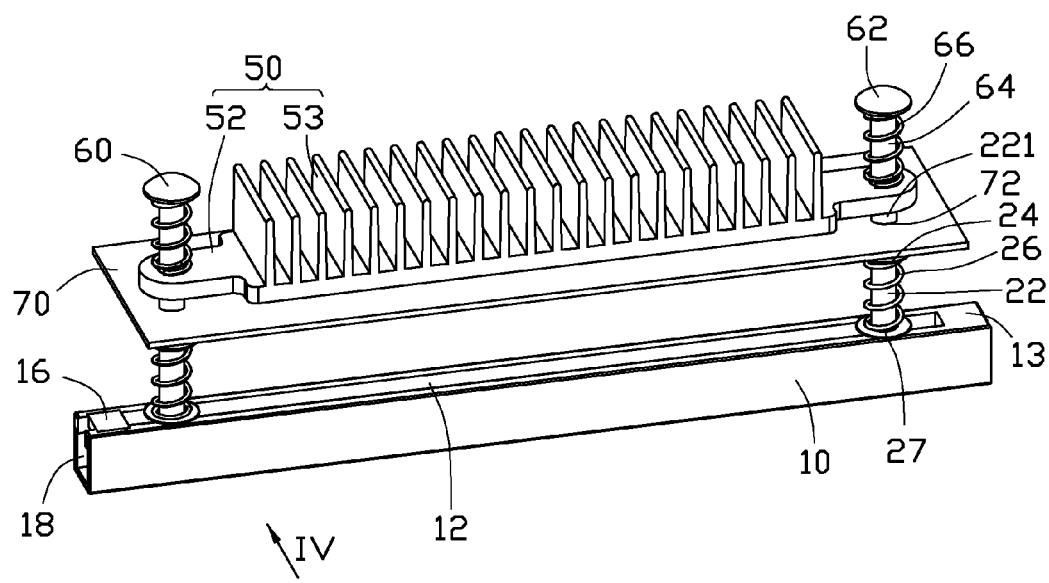
FIG. 3 is an assembled, isometric view of the guiding apparatus of FIG. 1, a circuit board, and a heat sink.

Referring to FIGS. 3 and 4, the heat sink 50 is elongated and includes a base 52, and a plurality of fins 53 extending from the base 52. The base 52 includes a pair of through holes 54 defined in two opposite ends thereof, for receiving a pair of fasteners 60 therein. Each fastener 60 includes a head 62, a shaft 64 extending from the head 62 with an elastic member 66 disposed around the shaft 64, and a plurality of flexible barbs 68 formed on a distal end of the shaft 62. The barbs 68 of each fastener 60 are squeezed through the corresponding through hole 54 of the heat sink 50 and clasped to the bottom wall of the base 52 by action of the elastic element 66 resisting against the base 52 of the heat sink 50.

The circuit board 70 includes a pair of mounting holes 72 defined therein, corresponding to the fasteners 60 of the heat sink 50.

In assembly of the guiding apparatus 1, the two guiding members 20 are received in the sliding groove 12 of the seat 10, with the first blocks 23 held in the sliding groove 12 from the entry 18 thereof and the top wall 13 of the seat 10 sandwiched between the gaskets 27 and the corresponding first blocks 23. The limiting board 16 is inserted into the limiting slot 14 of the seat 10 to cover the entry 18. The guiding apparatus 1 is disposed below the circuit board 70, with the second ends 221 of the posts 22 of the guiding members 20 extending through the mounting holes 72 of the circuit board 70 and the second blocks 24 of the guiding members 20 abutting against a bottom wall of the circuit board 70.

To attach the heat sink 50 to the circuit board 70, the heat sink 50 is placed above the circuit board 70, with the barbs 68 of the fasteners 60 received in the locating holes 222 of the posts 22 of the guiding apparatus 1. Applying an external force to the heads 62 of the fasteners 60 in a direction toward the base 52 of the heat sink 50, the elastic member 66 is flexed and the fasteners 60 move toward the circuit board 70. The barbs 68 of the fasteners 60 are further flexed to be squeezed closer to easily extend through the mounting holes 72 of the circuit board 70, with further movement of the fasteners 60. At the same time, the resilient members 26 are flexed and the posts 22 move toward the seat 10. When the external force is released, the elastic members 66 rebound to drive the corresponding fasteners 60 to move upward and the barbs 68 withdraw from the locating holes 222 of the guiding members 20 and rebound to abuts against the bottom wall of the circuit board 70. At the same time, the elastic members 66 rebound to push the base 52 of the heat sink 50 to contact the electronic element 74. Thus, the heat sink 50 is conveniently attached to the circuit board 70. During the initiation of the attachment, the heat sink 50 may not directly contact the electronic element 74, but with the barbs 68 of the fasteners 60 received in the locating holes 222 of the guiding member 20, may allow for a uniform force to be applied to the heat sink 50 on the electronic element 74.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A guiding apparatus for guiding a heat sink to be easily attached to a circuit board to cool an electronic element mounted on the circuit board, the heat sink comprising a plurality of fasteners with flexible barbs movably attached thereto, the guiding apparatus comprising:
   a seat defining a sliding groove; and
   a plurality of guiding members slidably received in the sliding groove, each guiding member comprising a post, a first block and a second block surrounding the post, and a resilient member, the first block received in the sliding groove, the resilient member slidably surrounding the post and sandwiched between the seat and the second block, a locating hole defined in an end of the post adjacent to the second block to engage with the barbs of the fasteners;
   wherein the seat is channel-shaped, the sliding groove is inverted T-shaped and extends through a wall of the seat along a length thereof, for the wall of the seat to be sandwiched between the first block of each of the guiding members and the corresponding resilient members thereof.

2. The guiding apparatus of claim 1, wherein the sliding groove further extends through an end of the seat to form an entry for allowing the guiding members to be received in the sliding groove.

3. The guiding apparatus of claim 2, wherein a limiting slot is defined in the wall of the seat along a width thereof to receive a limiting board therein, whereby covering the entry of the sliding groove.

4. The guiding apparatus of claim 1, wherein the first block is formed at an end of the post far away from the locating hole.

5. The guiding apparatus of claim 1, wherein the second block threadedly surrounds the post.

6. The guiding apparatus of claim 1, wherein each guiding member further comprises a gasket slidably surrounding the post thereof and located between the seat and the resilient member.

7. A heat dissipation assembly comprising:
   a circuit board comprising an electronic element mounted thereon, a pair of mounting holes defined beside the electronic element;
   a heat sink placed on a side of the circuit board to cool the electronic element and comprising a base, a pair of fasteners movably extending through the base for corresponding to the mounting holes, each fastener comprising a plurality of flexible barbs formed at an end thereof; and
   a guiding apparatus disposed on an opposite side of the circuit board and comprising a pair of guiding posts movably extending through or withdrawing from the mounting holes of the circuit board, a locating hole defined in each guiding post to engage with the barbs of a corresponding one of the fasteners;
   wherein the guiding apparatus further comprises an elongated seat, a sliding groove is defined in the seat along a length thereof, the guiding posts are slidably received in the sliding groove; and
   wherein the sliding groove is inverted T-shaped, a first block and a second block are set at each guiding post, the first block is received in the sliding groove, a resilient member movably surrounds the guiding post and locates between the second block and the seat, for sandwiching the seat with the first block.

8. The heat dissipation assembly of claim 7, wherein the sliding groove further extends through an end of the seat to form an entry for allowing the guiding posts and the first blocks to be received in the sliding groove.

9. The heat dissipation assembly of claim 8, wherein a limiting slot is defined in a wall of the seat along a width thereof to receive a limiting board therein, whereby covering the entry of the sliding groove.

10. The heat dissipation assembly of claim 7, wherein the second block threadedly surrounds the guiding post.

11. The heat dissipation assembly of claim 7, wherein the guiding apparatus further comprising two gaskets each slidably surrounding the guiding post and located between the seat and the resilient member.

12. The heat dissipation assembly of claim 7, wherein each fastener further comprises a head, a shaft extending from the head with an elastic member disposed around the shaft and located between the base of the heat sink and the head, the barbs are formed on a distal end of the shaft.

* * * * *